United States Patent
Graham et al.

(10) Patent No.: US 6,816,425 B2
(45) Date of Patent: *Nov. 9, 2004

(54) BALANCED SENSE AMPLIFIER CONTROL FOR OPEN DIGIT LINE ARCHITECTURE MEMORY DEVICES

(75) Inventors: Scot M. Graham, Boise, ID (US); Scott J. Derner, Meridian, ID (US); Stephen R. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/775,231

(22) Filed: Feb. 11, 2004

(65) Prior Publication Data

US 2004/0158690 A1 Aug. 12, 2004

Related U.S. Application Data

(63) Continuation of application No. 10/317,106, filed on Dec. 12, 2002, now Pat. No. 6,717,873, which is a continuation of application No. 09/805,933, filed on Mar. 15, 2001, now Pat. No. 6,515,925.

(51) Int. Cl.[7] .................................................. G11C 7/00
(52) U.S. Cl. .................... 365/205; 365/207; 365/208

(58) Field of Search ................................ 365/205, 207, 365/208, 185.13, 230.03, 189.04, 63

(56) References Cited

U.S. PATENT DOCUMENTS

| | | | |
|---|---|---|---|
| 5,396,465 A | | 3/1995 | Oh et al. |
| 5,546,343 A | | 8/1996 | Elliott et al. |
| 5,610,868 A | * | 3/1997 | Inaba et al. .................. 365/205 |
| 5,844,833 A | | 12/1998 | Zagar et al. |
| 6,147,919 A | | 11/2000 | Kawabata et al. |
| 6,226,212 B1 | | 5/2001 | Sakamoto et al. |
| 6,515,925 B2 | | 2/2003 | Graham et al. |
| 6,717,873 B2 | * | 4/2004 | Graham et al. .............. 365/205 |

FOREIGN PATENT DOCUMENTS

JP     A-9-167486     6/1997

* cited by examiner

Primary Examiner—David Lam
(74) Attorney, Agent, or Firm—Dickstein Shapiro Morin & Oshinsky LLP

(57) ABSTRACT

A balanced sense amplifier control for open digit line architecture memory devices. Firing of the sense amplifiers on each side of a section of a memory device is controlled by a two stage NAND gate logic circuit that utilizes a tree routing scheme. By gating the global signal with a section signal through the two stage NAND gate logic circuit, the sense amplifiers on each side of a section can be fired simultaneously.

11 Claims, 6 Drawing Sheets

BALANCED SENSE AMPLIFIER CONTROL FOR OPEN DIGIT LINE ARCHITECTURE MEMORY DEVICES

CROSS REFERENCE TO RELATED APPLICATIONS

The present application is a continuation application of U.S. patent application Ser. No. 10/317,106, filed on Dec. 12, 2002, (now U.S. Pat. No. 6,717,873, issued on Apr. 6, 2004), which in turn is a continuation application of U.S. patent application Ser. No. 09/805,933, filed on Mar. 15, 2001, (now U.S. Pat. No. 6,515,925, issued on Feb. 4, 2003), the disclosures of which are herewith incorporated by reference in their entirety.

BACKGROUND OF THE INVENTION

1. Field of the Invention

The present invention relates generally to semiconductor memory devices and, more particularly, to an open digit line architecture memory device having a balanced sense amplifier control.

2. Description of the Related Art

An increasing number of electronic equipment and electronic-based systems require some form of high-speed memory devices for storing and retrieving information (or "data"). While the types of such memory devices vary widely, semiconductor memory devices are most commonly used in memory applications requiring implementation in a relatively small area. Within this class of semiconductor memory devices, the DRAM (Dynamic Random Access Memory) is one of the more commonly used types.

The DRAM has memory arrays consisting of a number of intersecting row and column lines of individual transistors or memory cells. In a conventional dynamic random access memory (DRAM) device each memory cell, or memory bit, consists of one transistor and one capacitor. A terminal of the transistor is connected to a digit line, or bitline, of the memory device. Another terminal of the transistor is connected to a terminal of the capacitor and the gate terminal of the transistor is connected to a wordline of the memory device. The transistor thus acts as a gate between the digit line and the capacitor.

The second terminal of the capacitor is connected to a voltage rail which carries a voltage, such as VCC/2. Thus, when the wordline for a particular cell is active, the gate transistor is in a conducting state and the capacitor is connected to the digit line. The capacitor stores a charge that, depending on whether the polarity of the voltage across the capacitor is positive or negative, represents either a logic high or a logic low value.

Typically, a microcomputer circuit selects (or activates) particular row and column lines to access selected memory cells. "Access" typically refers to reading data from or writing data to selected memory cells. Reading data from the memory cells involves the use of a sense amplifier to detect whether the voltage level stored in the memory cell represents a binary one or a binary zero.

Memory devices are typically constructed with complementary digit lines of equal capacitance. Sense amplifiers are connected between the digit lines and operate to sense the differential voltage across the digit lines. An open digit line architecture, as illustrated in FIG. 1, features the sense amplifier circuits 10 between arrays 12, 14, 16, 18. True and complement digit lines, such as for example D1 20 and D1*22 come from separate arrays 14, 16 on each side of the sense amplifiers 10 as illustrated in FIG. 1.

Operation of the sense amplifiers 10 is accomplished by applying various signals to each sense amplifier to fire the sense amplifiers as is well known in the art. FIG. 2 illustrates the circuitry of a sense amplifier 10 of FIG. 1. As is generally known in the art, the term sense amplifier includes a collection of circuit elements connected to the digit lines of a DRAM array. This collection typically includes devices for equilibration and bias, one or more N-sense amplifiers, one or more P-sense amplifiers, and devices connecting selected digit lines to input/output signal lines as will be described below.

As shown in FIG. 2, sense amplifier 10 includes a P-sense amplifier 30 and an N-sense amplifier 40 for sensing charge stored in the selected memory cell of the selected array via a voltage differential on the pair of digit lines D1 20 and D1*22. Equilibration circuit 50 is provided to equilibrate the digit lines D1 20 and D1*22. Equilibration circuit 50 includes transistor 52 with a first source/drain region coupled to digit line D1 20, a second source/drain region coupled to digit line D1*22 and a gate coupled to receive an equilibration signal EQ. Equilibration circuit 50 further includes first and second transistors 54 and 56. Transistor 54 includes a first source/drain region that is coupled to digit line D1 20, a gate that is coupled to receive the equilibration signal EQ and a second source/drain region that is coupled to receive an equilibration voltage Veq, which is typically equal to Vcc/2. Second transistor 56 includes a first source/drain region that is coupled to digit line D1*22, a gate that is coupled to receive the equilibration signal EQ and a second source/drain region that is coupled to the equilibration voltage Veq. When the signal EQ is at a high logic level, equilibration circuit 50 effectively shorts digit line D1 20 to digit line D1*22 such that both lines are equilibrated to the voltage Veq.

When P-sense amplifier 30 and N-sense amplifier 40 have sensed the differential voltage across the digit lines D1 20 and D1*22 (as described below), a signal representing the charge stored in the accessed memory cell is output from the DRAM device on the input/output (I/O) lines I/O 36 and I/O*38 by connecting the I/O lines I/O 36 and I/O*38 to the digit lines D1 20 and D1*22, respectively. A column select (CSEL) signal is applied to transistors 40, 42 to turn them on and connect the digit lines D1 20 and D1*22 to the I/O lines I/O 36 and I/O*38.

The operation of the P-sense amplifier 30 and N-sense amplifier 40 is as follows. These amplifiers work together to detect the access signal voltage and drive the digit lines D1 20 and D1*22 to Vcc and ground accordingly. As shown in FIG. 2, the N-sense amplifier 40 consists of cross-coupled NMOS transistors 42, 44 and drives the low potential digit line to ground. Similarly, the P-sense amplifier 30 consists of cross-coupled PMOS transistors 32, 34 and drives the high potential digit line to Vcc. The NMOS pair 42, 44 or N-sense-amp common node is labeled RNL*. Similarly, the P-sense-amp 30 common node is labeled ACT (for ACTive pull-up). Initially, RNL* is biased to Vcc/2 and ACT is biased to ground. Since the digit line pair D1 20 and D1*22 are both initially at Vcc/2 volts, the N-sense-amp transistors 42, 44 remain off due to zero Vgs potential. Similarly, both P-sense-amp transistors 32, 34 remain off due to their positive Vgs potential. A signal voltage develops between the digit line pair 20, 22 when the memory cell access occurs. While one digit line contains charge from the cell access, the other digit line serves as a reference for the sensing operation. The sense amplifier firing generally occurs sequentially rather than concurrently. The N-sense-amp 40 fires first and the P-sense-amp 30 second. The N-sense amplifier is fired by providing a signal, labeled NSA to a transistor 46 connecting the common node of the N-sense amplifier to ground. Dropping the RNL*signal toward ground will fire the N-sense-amp 40. As the voltage between RNL* and the digit lines approaches Vt, the NMOS transistor whose gate connection is to the higher voltage digit line will begin to conduct. Conduction results in the discharge of the low voltage digit line toward the RNL* voltage. Ultimately, RNL* will reach ground, bringing the digit line with it. Note that the other NMOS transistor will not conduct since its gate voltage derives from the low voltage digit line, which is discharging toward ground.

Shortly after the N-sense-amp 40 fires, ACT will be driven toward Vcc by applying a low signal PSA to PMOS transistor 48, thus connecting the common node of the P-sense amplifier 30 to Vcc. This activates the P-sense-amp 30 that operates in a complementary fashion to the N-sense-amp 40. With the low voltage digit line approaching ground, a strong signal exists to drive the appropriate PMOS transistor into conduction. This will charge the high voltage digit line toward Vcc, ultimately reaching Vcc. Since the memory bit transistor remains on during sensing, the memory bit capacitor will charge to the RNL* or ACT voltage level. The voltage, and hence charge, which the memory bit capacitor held prior to accessing will restore a full level, i.e., Vcc for a logic one and GND for a logic zero.

In an open digit line architecture as illustrated in FIG. 1, sense amplifiers on each side of an array, or section, are fired. Typically, as illustrated in FIG. 3, a global signal, such as for example the EQ, NSA or PSA signal, is driven across the memory device by a driver 60 and input to a NAND gate 62 with a section signal, supplied by a signal source such as a buffer amplifier 61, to fire the sense amps on each side of a specific section. For example, as illustrated in FIG. 3, if a row was fired in array 14, the sense amps would fire on both the left and right side of array 14. Problems exist, however, due to the signal noise inherent in an open digit line architecture (due to various coupling effects) and signal propagation of the global signal. For example, the signal propagation causes the left side to fire slightly before the right side. This slight difference in firing time can cause a margin imbalance on one side of the section as opposed to the other side of the section. That is, the side that fires last will have a reduced signal sensitivity margin for sensing data which can lead to erroneous reading of the data signal. Ideally both sense amps on each side should fire simultaneously.

Thus, there exists a need for an open digit line architecture in which the sense amplifiers on each side of a section are fired simultaneously, thus eliminating margin imbalance on one side of the section as opposed to the other side of the section.

SUMMARY OF THE INVENTION

The present invention overcomes the problems associated with the prior art and provides a method and apparatus for simultaneously firing the sense amplifiers on each side of a section, thereby significantly reducing any margin imbalance between the two sides.

In accordance with the present invention, firing of the sense amplifiers on each side of a section is controlled by a two stage NAND gate logic circuit that utilizes a tree routing scheme. By gating the global signal with a section signal through the two stage NAND gate logic circuit, the sense amplifiers on each side of a section can be fired simultaneously.

These and other advantages and features of the invention will become more readily apparent from the following detailed description of the invention which is provided in connection with the accompanying drawings.

DETAILED DESCRIPTION OF THE PREFERRED EMBODIMENTS

Figure 1:
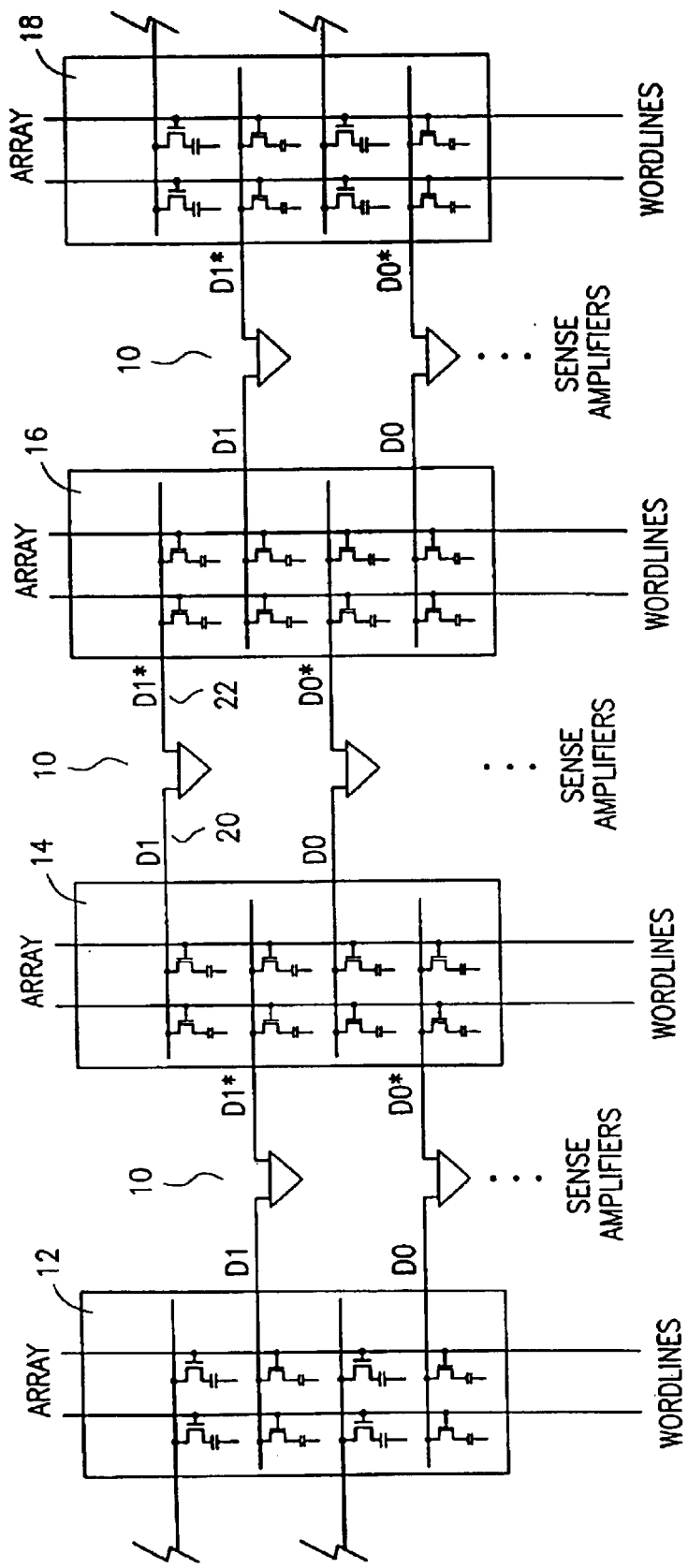
FIG. 1 illustrates in block diagram form a portion of a memory device having an open digit line architecture.

The present invention will be described as set forth in the exemplary embodiments illustrated in FIGS. 4–6. Other embodiments may be utilized and structural or logical changes may be made without departing from the spirit or scope of the present invention. Like items are referred to by like reference numerals.

In accordance with the present invention, firing of the sense amplifiers on each side of a section is controlled by a two stage NAND gate logic circuit that utilizes a tree routing scheme. By gating the global signal with a section signal through the two stage NAND gate logic circuit, the sense amplifiers on each side of a section can be fired simultaneously.

Figure 4:
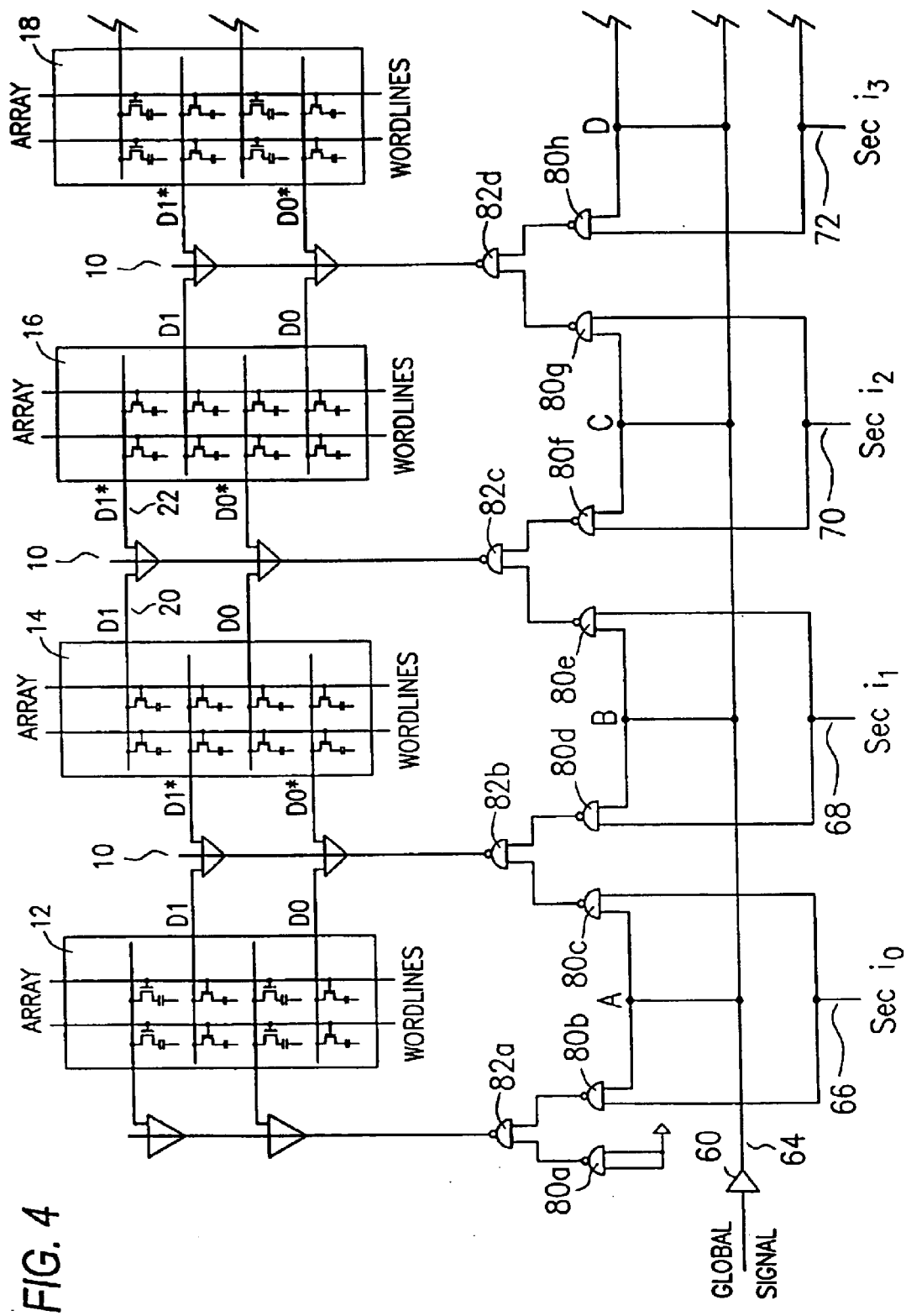
FIG. 4 illustrates a portion of a circuit for firing sense amplifiers in a memory device with an open digit line architecture according to one embodiment of the present invention.

FIG. 4 illustrates a portion of a circuit for firing sense amplifiers in a memory device with an open digit line architecture according to one embodiment of the present invention. As illustrated in FIG. 4, the firing of the sense amplifiers 10 is controlled by a global signal and a section signal that are passed through a two stage NAND gate logic circuit. The two stage NAND gate logic circuit includes a first stage of NAND gates 80a–80h. The first NAND gate 80a, located at the edge of the row of arrays 12, 14, 16 has both inputs connected to ground. NAND gates 80b and 80c each have a first input connected to the global signal line 64 and a second input connected to receive the section signal Sec $i_0$ on line 66. NAND gates 80d and 80e each have a first input connected to the global signal line 64 and a second input connected to receive the section signal Sec $i_1$ on line 68. NAND gates 80f and 80g each have a first input connected to the global signal line 64 and a second input connected to receive the section signal Sec $i_2$ on line 70.

The second stage of the two stage NAND gate logic circuit includes NAND gates 82a–82d. The output signal from each NAND gate 82a–82d is provided to the sense amplifiers 10 on a respective side of the arrays 12, 14, 16. NAND gate 82a has a first input connected to the output of NAND gate 80a and a second input connected to the output of NAND gate 80b. The output of NAND gate 82a is input to the sense amplifiers 10 located on the left side of array 12 as illustrated. NAND gate 82b has a first input connected to the output of NAND gate 80c and a second input connected to the output of NAND gate 80d. The output of NAND gate 82b is input to the sense amplifiers 10 located between array 12 and array 14 as illustrated. NAND gate 82c has a first input connected to the output of NAND gate 80e and a second input connected to the output of NAND gate 80f. The output of NAND gate 82c is input to the sense amplifiers 10 located between array 14 and array 16 as illustrated. NAND gate 82d has a first input connected to the output of NAND gate 80g and a second input connected to the output of NAND gate 80h. The output of NAND gate 82d is input to the sense amplifiers 10 located between array 14 and array 16 as illustrated.

In accordance with the tree routing of the present invention, it is preferable for the global signal line to connect to each pair of corresponding first stage NAND gates at a point equidistant between the pair to ensure there is no difference in signal propagation for each pair. Thus, for example, node A is a point equidistant from NAND gates 80b and 80c, node B is a point equidistant from NAND gates 80d and 80e, node C is a point equidistant from NAND gates 80f and 80g, etc. Additionally, it is also preferable for the routing distance from each pair of the first stage of NAND gates to their corresponding second stage NAND gates to be of equal length. Thus, for example, the routing distance from NAND gates 80a and 80b to NAND gate 82a, NAND gates 80c and 80d to NAND gate 82b, NAND gates 80d and 80e to NAND gate 82c, etc. is the same to ensure that the selected pair of second stage NAND gates fire simultaneously as will be further described below.

The operation of the two stage NAND gate logic circuit is as follows. Suppose for example a row in array 14 will be accessed. Accordingly, the sense amplifiers 10 on each side of the array 14 will be fired. A global signal, such as for example the NSA or EQ signal, will be driven high by driver 60 and input to the first input of each NAND gate 80b–80h. It should be understood that a separate two stage NAND gate logic circuit is required for each signal, that is, for each of the signals NSA, EQ, PSA, etc. In accordance with the present invention, the tree routing of the global signal ensures there is no difference in signal propagation delay between corresponding pairs of NAND gates and the global signal will be input to a corresponding pair of NAND gates simultaneously. Thus for example, NAND gates 80b and 80c receive the global signal at the same time, NAND gates 80d and 80e receive the global signal at the same time, and NAND gates 80f and 80g receive the global signal at the same time. Because a row in array 14 is being accessed, the signal Sec $i_1$ on line 68 will be driven high by a memory controller (not shown), while the remaining section signals Sec $i_0$, Sec $i_2$ and Sec $i_3$ will remain low. Thus, the high input of the global signal on line 64 and the low section signal inputs on lines 66, 70 and 72 will cause a high output from each of NAND gates 80b, 80c, 80f, 80g and 80h. Additionally, since both the inputs to NAND gate 80a are tied to ground, i.e., a low signal, the output of NAND gate 80a will be a high output. The high input of the global signal on line 64 and the high section signal Sec $i_1$ on line 68 will cause a low output from each of NAND gates 80d and 80e.

The inputs to NAND gates 82a and 82d will both be high (from NAND gates 80a, 80b and 80g, 80h, respectively). Thus, the outputs from NAND gates 82a and 82d will be low. The first input to NAND gates 82b and 82c will be high (from NAND gates 80c and 80f, respectively) and the second input to NAND gates 82b and 82c will be low (from NAND gates 80d and 80e, respectively). Thus, the output from NAND gates 82b and 82c will be high.

Figure 2:
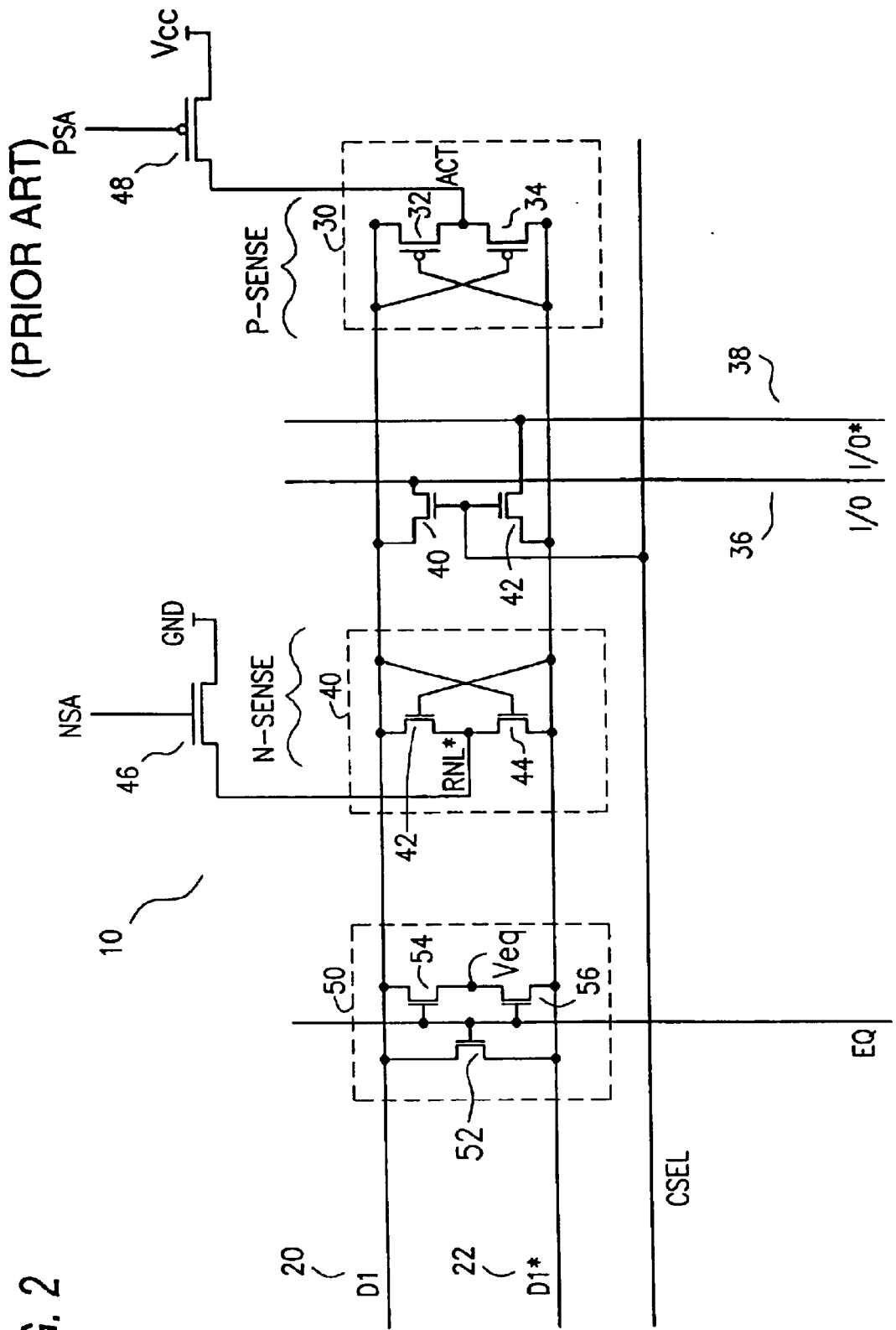
FIG. 2 illustrates a conventional sense amplifier circuit.
Figure 3:
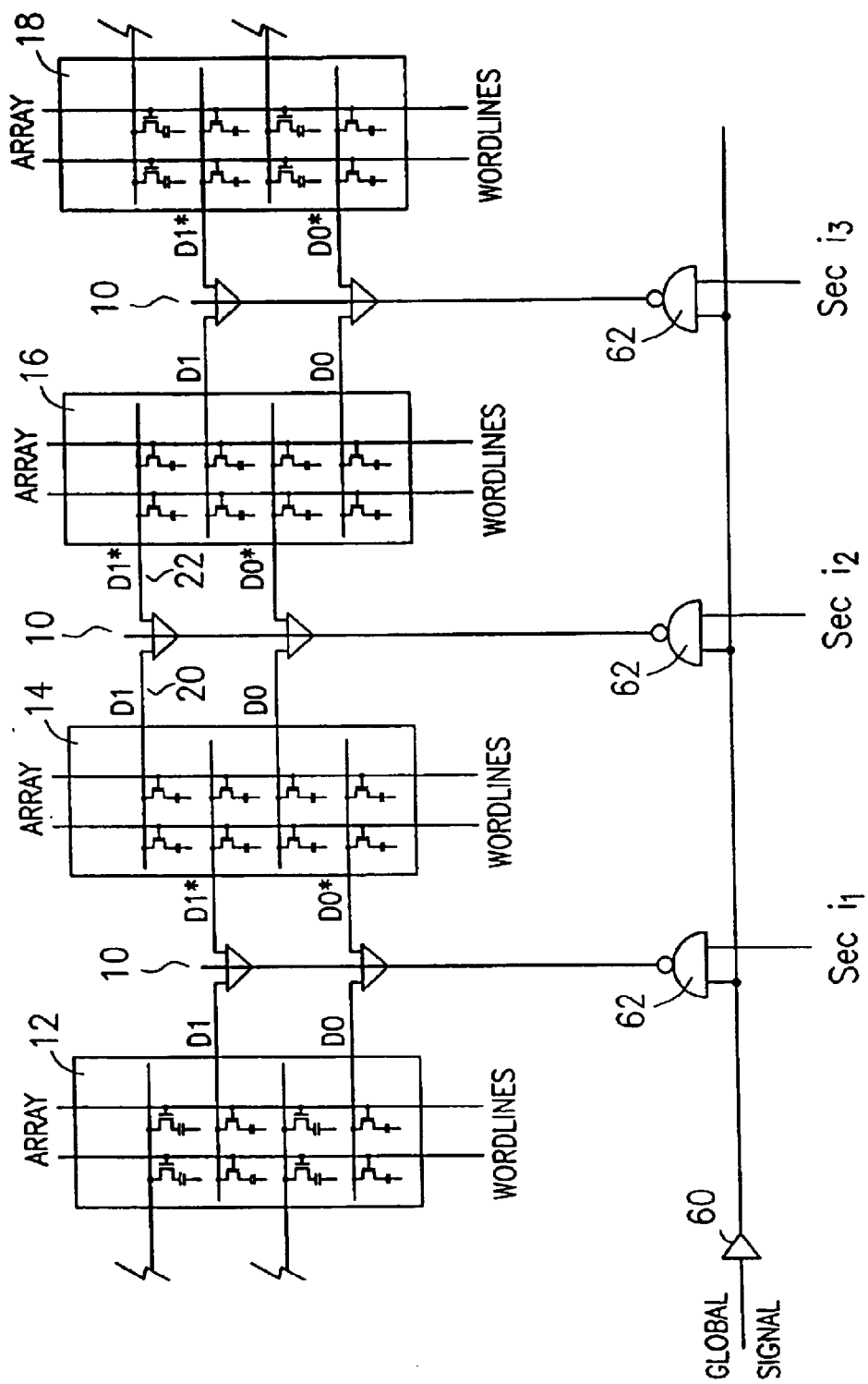
FIG. 3 illustrates a conventional circuit for firing sense amplifiers in a memory device with an open digit line architecture.

The sense amplifiers 10 on each side of array 14, upon receiving the high signals from the outputs of NAND gates 82b and 82c, will then fire. For example, if the global signal is an EQ signal for the equilibration circuit 50 (FIG. 2), the high output signal from NAND gates 82b, 82c will be applied to the gates of transistors 52, 54, 56. Alternatively, if the global signal is the NSA signal to fire the N-sense amplifier 40, the high output signal from NAND gates 82b, 82c will be applied to the gate of transistor 46. The sense amplifiers 10 receiving a low output signal from NAND gates 82a, 82d will not fire. As noted above, since the tree routing of the global signal eliminates any difference in the propagation delay between corresponding pairs of NAND gates, the outputs from NAND gates 82b and 82c will transition from low to high at the same time, thus firing the sense amplifiers 10 on each side of array 14 at the same time.

Thus, in accordance with the present invention, by gating the global signal with a section signal through the two stage NAND gate logic circuit, the sense amplifiers on each side of a section can be fired simultaneously.

Figure 5:
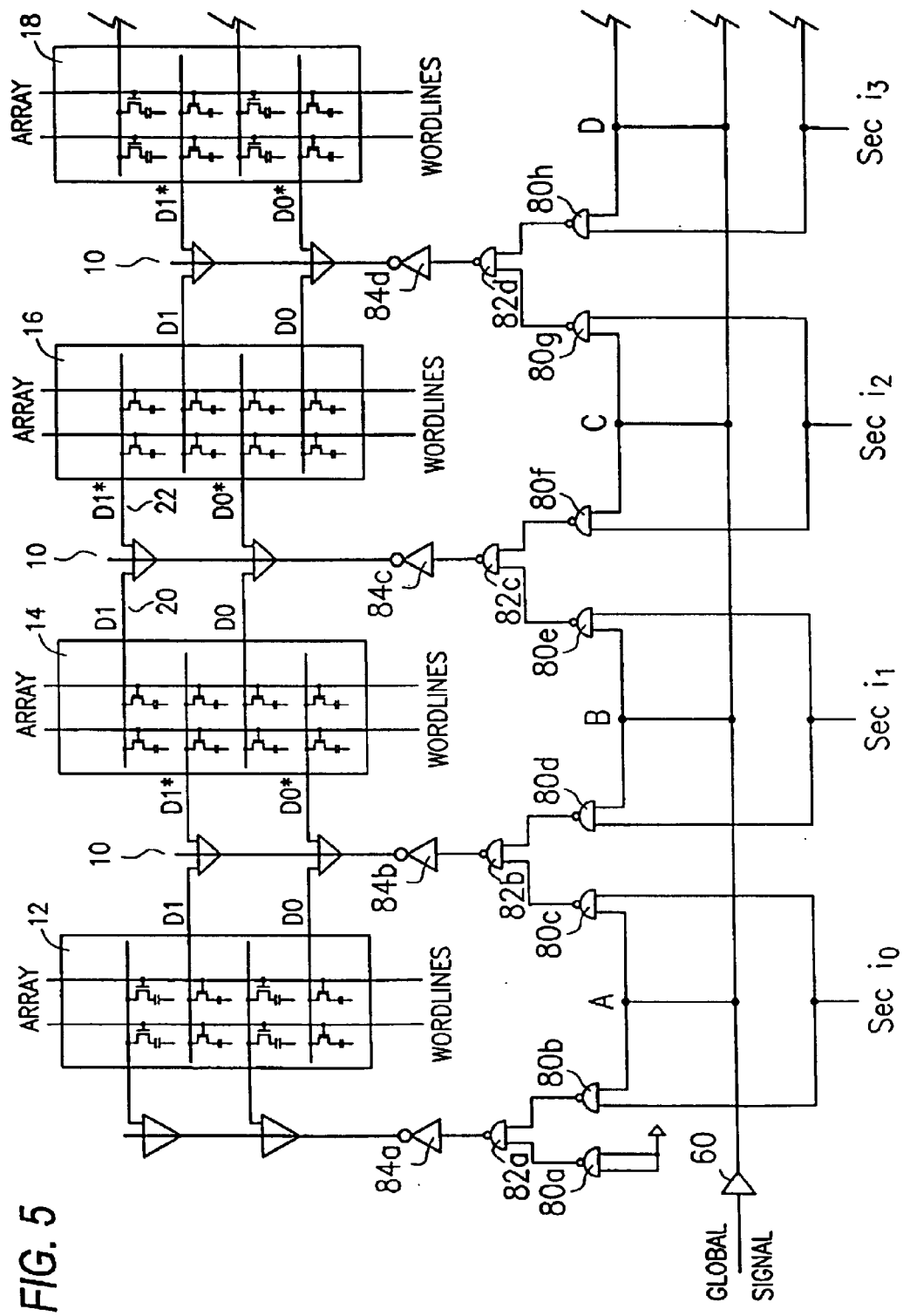
FIG. 5 illustrates a portion of a circuit for firing sense amplifiers in a memory device with an open digit line architecture according to another embodiment of the present invention.

FIG. 5 illustrates a portion of a circuit for firing sense amplifiers in a memory device with an open digit line architecture according to another embodiment of the present invention. In the embodiment of FIG. 5, the two stage logic circuit can be utilized to provide a low signal required to fire the sense amplifiers 10. For example, to fire the P-sense amplifier 30 of a sense amplifier 10, a low signal PSA must be applied to the gate of transistor 48 to turn on transistor 48. The circuit of FIG. 5 is identical to that of FIG. 4, except that an inverter 84a, 84b, 84c, 84d is provided at the output of NAND gate 82a, 82b, 82c and 82d, respectively.

Thus, if as in the above example a row in array 14 is to be accessed, the high outputs from NAND gates 82b and 82c will be inverted by inverters 84b, 84c respectively and the low outputs from the inverters 84b, 84c will be applied to the gate of transistor 48 in the respective sense amplifiers 10 to fire the P-sense amplifier 30 in each sense amplifier 10. The low outputs from NAND gates 82a and 82b will be inverted by inverters 84a, 84d respectively and the high outputs from the inverters 84a, 84d will maintain the transistors 48 in an off state, thus not firing the respective P-sense amplifiers 30 in the other arrays.

Figure 6:
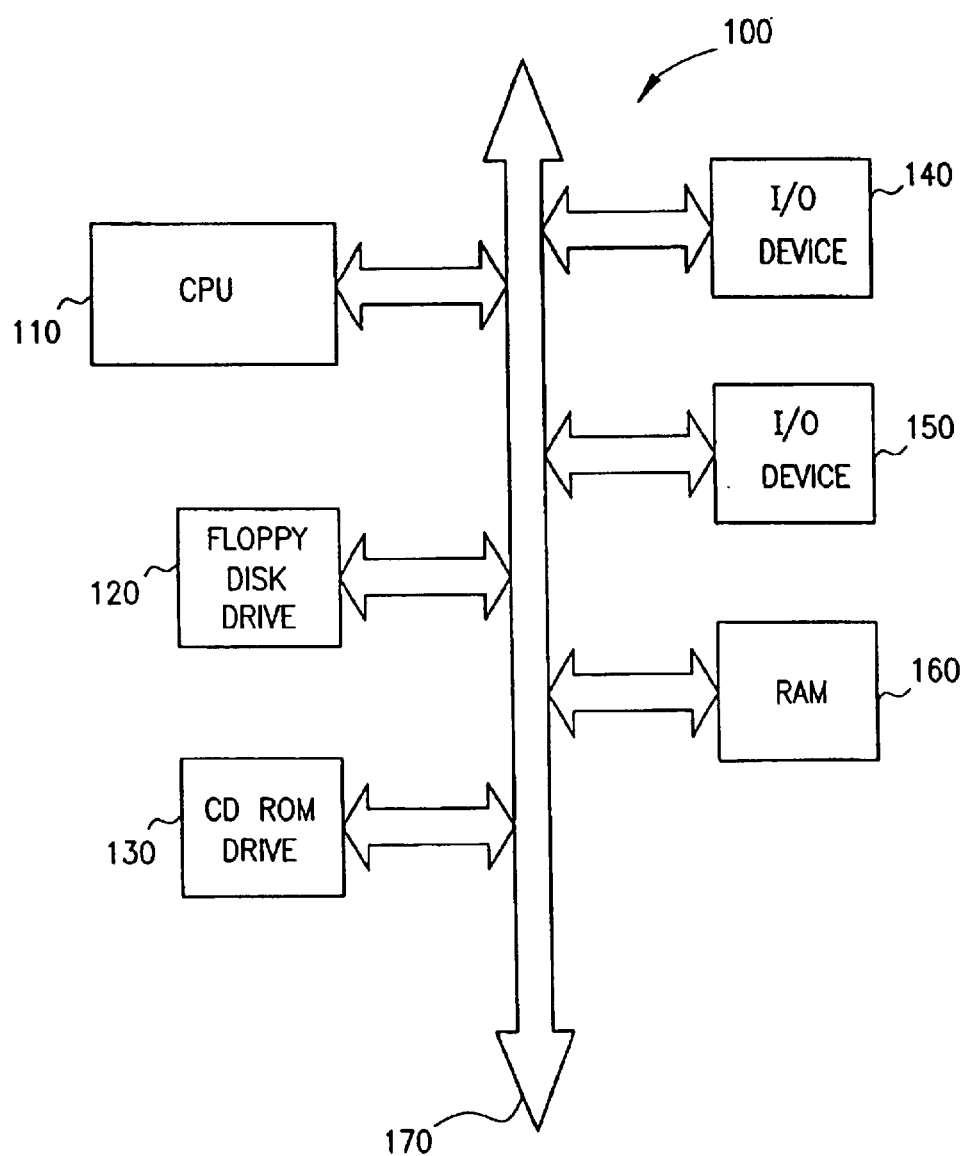
FIG. 6 illustrates in block diagram form a processor system that includes a memory circuit having a circuit according to the present invention.

A typical processor based system that includes memory circuits having two stage logic circuit according to the present invention is illustrated generally at 100 in FIG. 6. A computer system is exemplary of a system having memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 110, for example, a microprocessor, that communicates with one or more input/output (I/O) devices 140, 150 over a bus 170. The computer system 100 also includes random access memory (RAM) 160, and, in the case of a computer system may include peripheral devices such as a floppy disk drive 120 and a compact disk (CD) ROM drive 130 which also communicate with CPU 110 over the bus 170. RAM 160 is preferably constructed as an integrated circuit that includes a two stage NAND gate logic circuit as previously described with respect to FIGS. 4 and 5. It may also be desirable to integrate the processor 110 and memory 160 on a single IC chip.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A two-stage memory device control circuit comprising:
   a first signal node disposed on a first side of an array of memory devices;
   a second signal node disposed on a second side of said array of memory devices;
   a first logic gate circuit having a first output coupled to said first signal node;
   a second logic gate circuit having a second output coupled to said second signal node;
   a third logic gate circuit having a third output coupled to a first input of said first logic gate circuit;
   a fourth logic gate circuit having a fourth output coupled to a second input of said second logic gate circuit;
   a section selection signal node mutually coupled to a third input of said third logic gate circuit and to a fourth input of said fourth logic gate circuit; and
   a global signal node mutually coupled to a fifth input of said third logic gate circuit and to a sixth input of said fourth logic gate circuit, wherein said global signal node is signalingly equidistant from said fifth and sixth inputs.

2. A global signal line memory triggering system comprising:
   a first triggering circuit, said first triggering circuit being adapted to trigger a first sense amplifier at a first location of a memory array, said first triggering circuit including first and second NAND gates;
   a second triggering circuit, said second triggering circuit being adapted to trigger a second sense amplifier at a second location of said memory array, said second triggering circuit including third and fourth NAND gates;
   a selection node electrically coupled to said first and second triggering circuits at respective first and second inputs and adapted to receive a selection signal during a first time interval; and
   a global signal node electrically coupled to said first and second triggering circuits at respective third and fourth inputs, said global signal node being disposed electrically equidistant from said third and fourth inputs, said global signal node being adapted to receive a global signal during a second time interval within said first time interval.

3. A global signal line memory triggering system as defined in claim 2, wherein said third and fourth inputs comprise respective inputs of said second and fourth NAND gates.

4. A signaling circuit comprising:
   a first signal line disposed proximate to a first side of an array of memory cells;
   a second signal line disposed proximate to a second side of said array of memory cells;
   a first logic gate having a first output and first input, said first output being coupled to said first signal line;
   a second logic gate having a second output and a second input, said second output being coupled to said second signal line;
   a third logic gate having a third output coupled to said first input, said third logic gate having a third input and a fourth input, said third input being coupled to a section selection signal node;
   a fourth logic gate having a fourth output coupled to said second input, said fourth logic gate having a fifth input and a sixth input, said fifth input being coupled to said section selection signal node;
   a global signal node mutually coupled to said fourth and sixth inputs at a point electrically equidistant therebetween such that, respective first and second output signals are received substantially simultaneously at said first and second signal lines respectively when a global signal is received at said global signal node during a time interval when a selection signal is received at said selection signal node.

5. A signaling circuit as defined in claim 4 wherein said first and second sides are disposed in substantially parallel spaced relation to one another.

6. A signaling circuit as defined in claim 4 wherein send first, second, third and fourth logic gates are all NAND gates.

7. A signaling circuit as defined in claim 4 wherein said first and second signal lines are coupled to respective first and second sense amplifiers.

8. A signaling circuit as defined in claim 4 wherein said global signal comprises an equalization signal.

9. A signaling circuit as defined in claim 4 wherein said global signal comprises an N sense amplifier trigger signal (NSA).

10. A signaling circuit as defined in claim 4 wherein said global signal comprises AP said that the fire trigger signal (PSA).

11. A sense amplifier comprising:
    an NSA node, a PSA node, and an equalization node, said NSA node being coupled to a first tree structured signal routing circuit, said PSA node being coupled to a second tree structured signal routing circuit, and said equalization node being coupled to a third tree structured signal routing circuit.

* * * * *

UNITED STATES PATENT AND TRADEMARK OFFICE
CERTIFICATE OF CORRECTION

| | | |
|---|---|---|
| PATENT NO. | : 6,816,425 B2 | Page 1 of 1 |
| APPLICATION NO. | : 10/775231 | |
| DATED | : November 9, 2004 | |
| INVENTOR(S) | : Graham et al. | |

It is certified that error appears in the above-identified patent and that said Letters Patent is hereby corrected as shown below:

Column 8:

Claim 10, line 2, "AP said that the fire trigger signal (PSA)" should read --a P sense amplifier trigger signal (PSA)--.

Signed and Sealed this

Twenty-fourth Day of April, 2007

JON W. DUDAS
*Director of the United States Patent and Trademark Office*